(12) United States Patent
McCabe et al.

(10) Patent No.: US 8,673,122 B2
(45) Date of Patent: Mar. 18, 2014

(54) HOT TILE SPUTTERING SYSTEM

(75) Inventors: Ian A. McCabe, Holland, MI (US); Jeffrey D. Harlow, Holland, MI (US)

(73) Assignee: Magna Mirrors of America, Inc., Holland, MI (US)

( * ) Notice: Subject to any disclaimer, the term of this patent is extended or adjusted under 35 U.S.C. 154(b) by 343 days.

(21) Appl. No.: 12/754,951

(22) Filed: Apr. 6, 2010

(65) Prior Publication Data

US 2010/0252418 A1    Oct. 7, 2010

Related U.S. Application Data

(60) Provisional application No. 61/167,234, filed on Apr. 7, 2009.

(51) Int. Cl.
*C23C 14/34*    (2006.01)

(52) U.S. Cl.
USPC .................................. 204/298.12; 204/192.26

(58) Field of Classification Search
USPC .................................................... 204/192.26
See application file for complete search history.

(56) References Cited

U.S. PATENT DOCUMENTS

| | | | |
|---|---|---|---|
| 4,435,042 A | 3/1984 | Wood et al. |
| 4,436,371 A | 3/1984 | Wood et al. |
| 4,712,879 A | 12/1987 | Lynam et al. |
| 4,826,289 A | 5/1989 | Vandenbrink et al. |
| 4,948,242 A | 8/1990 | Desmond et al. |
| 5,073,012 A | 12/1991 | Lynam |
| 5,076,673 A | 12/1991 | Lynam et al. |
| 5,140,455 A | 8/1992 | Varaprasad et al. |
| 5,142,407 A | 8/1992 | Varaprasad et al. |
| 5,151,816 A | 9/1992 | Varaprasad et al. |
| 5,198,063 A | 3/1993 | Howard et al. |
| 5,253,109 A | 10/1993 | O'Farrell et al. |
| 5,327,288 A | 7/1994 | Wellington et al. |
| 5,406,414 A | 4/1995 | O'Farrell et al. |
| 5,514,259 A | 5/1996 | Shiota et al. |
| 5,525,264 A | 6/1996 | Cronin et al. |
| 5,567,360 A | 10/1996 | Varaprasad et al. |
| 5,610,756 A | 3/1997 | Lynam et al. |

(Continued)

OTHER PUBLICATIONS

Minshall, H., In CRC Handbook of Chemistry and Physics, 73rd Edition, Lide, D. R., Ed., CRC Press, Boca Raton, FL, 1992.*

(Continued)

*Primary Examiner* — Keith Hendricks
*Assistant Examiner* — Timon Wanga
(74) *Attorney, Agent, or Firm* — Gardner, Linn, Burkhart & Flory, LLP (57) ABSTRACT

A system and method for sputtering a coating onto a glass substrate in a vacuum deposition chamber includes providing a backing plate with a separating element disposed at the backing plate. At least one target element or tile is disposed on a surface of the separating element, wherein an expansion gap is provided to allow for expansion of the target relative to the separating element during the sputtering process. The method includes sputtering material from the target and heating the target to a substantially elevated temperature during the sputtering process. The separating element may be a sheet having a low-coefficient of friction surface, and the target may be disposed on the low-coefficient of friction surface of the separating element. The separating element may thermally insulate the target from the backing plate, whereby the target may be heated to a substantially greater temperature than the backing plate during the sputtering process.

12 Claims, 4 Drawing Sheets

Hot tile, unbonded magnetron sputtering assembly with a Grafoil sheet.

(56) References Cited

U.S. PATENT DOCUMENTS

| | | | |
|---|---|---|---|
| 5,668,663 | A | 9/1997 | Varaprasad et al. |
| 5,724,187 | A | 3/1998 | Varaprasad et al. |
| 5,730,847 | A * | 3/1998 | Hanaguri et al. ........ 204/298.41 |
| 5,830,809 | A | 11/1998 | Howard et al. |
| 5,910,854 | A | 6/1999 | Varaprasad et al. |
| 6,106,681 | A | 8/2000 | Saito et al. |
| 6,154,306 | A | 11/2000 | Varaprasad et al. |
| 6,178,034 | B1 | 1/2001 | Allemand et al. |
| 6,318,870 | B1 | 11/2001 | Spooner et al. |
| 6,420,036 | B1 | 7/2002 | Varaprasad et al. |
| 6,598,980 | B2 | 7/2003 | Marusawa et al. |
| 6,690,268 | B2 | 2/2004 | Schofield et al. |
| 7,184,190 | B2 | 2/2007 | McCabe et al. |
| 7,195,381 | B2 | 3/2007 | Lynam et al. |
| 7,249,860 | B2 | 7/2007 | Kulas et al. |
| 7,255,451 | B2 | 8/2007 | McCabe et al. |
| 7,274,501 | B2 | 9/2007 | McCabe et al. |
| 7,289,037 | B2 | 10/2007 | Uken et al. |
| 7,338,177 | B2 | 3/2008 | Lynam |
| 7,420,756 | B2 | 9/2008 | Lynam |
| 7,507,438 | B2 | 3/2009 | Cherif et al. |
| 7,550,055 | B2 * | 6/2009 | Le et al. ........................ 156/276 |
| 7,574,794 | B2 | 8/2009 | Halsey, IV et al. |
| 7,626,749 | B2 | 12/2009 | Baur et al. |
| 2002/0008021 | A1 * | 1/2002 | Weigert et al. ........... 204/298.12 |
| 2002/0034639 | A1 * | 3/2002 | Mearini et al. ................ 428/408 |
| 2004/0222089 | A1 | 11/2004 | Inoue et al. |
| 2006/0283703 | A1 * | 12/2006 | Le et al. .................. 204/192.12 |
| 2006/0289305 | A1 * | 12/2006 | White ...................... 204/298.12 |
| 2007/0251814 | A1 * | 11/2007 | Beele et al. ................ 204/192.1 |
| 2009/0205879 | A1 | 8/2009 | Halsey IV et al. |
| 2009/0322705 | A1 | 12/2009 | Halsey, IV |

OTHER PUBLICATIONS

Fuller, D. D., in American Institute of Physics Handbook, 3rd Edition, Gray, D. E., Ed., McGraw-Hill, New York, 1972.*

Schlott, M., Kutzner, M., Gehman, B.L, Reger, N., and Stadermann, F.J., "P-31: Nodule Formation on Indium-Oxide Sputtering Targets", SID 96 Digest, 1997, pp. 1-5.

GrafTech International, Ltd Article, pp. 1-10.

* cited by examiner

Hot tile, unbonded magnetron sputtering assembly with a Grafoil sheet.

HOT TILE SPUTTERING SYSTEM

CROSS REFERENCE TO RELATED APPLICATION

The present application claims the benefit of U.S. provisional application Ser. No. 61/167,234, filed Apr. 7, 2009, which is hereby incorporated herein by reference in its entirety.

FIELD OF THE INVENTION

The present invention relates generally to the field of sputter coating and, more particularly, to sputter coating onto glass substrates for mirror reflective elements suitable for use on a vehicle.

BACKGROUND OF THE INVENTION

Conventional planar magnetron sputtering of ceramic materials (such as for sputtering of ITO, AZO, $TiO_2$, $Nb_2O_5$, and/or the like on a glass substrate of a mirror reflective element) uses ceramic tiles that are bonded (such as by indium solder, elastomer, nanofoils and/or the like) to a metal backing plate (such as Copper, Copper alloys, Molybdenum and/or the like). Typically, the backing plate forms a support structure for the tiles, provides a path for the electrical power (RF, AC, DC, pulsed) and acts as a thermal sink so that heat is removed from the tiles during the sputtering process.

Figure 1:
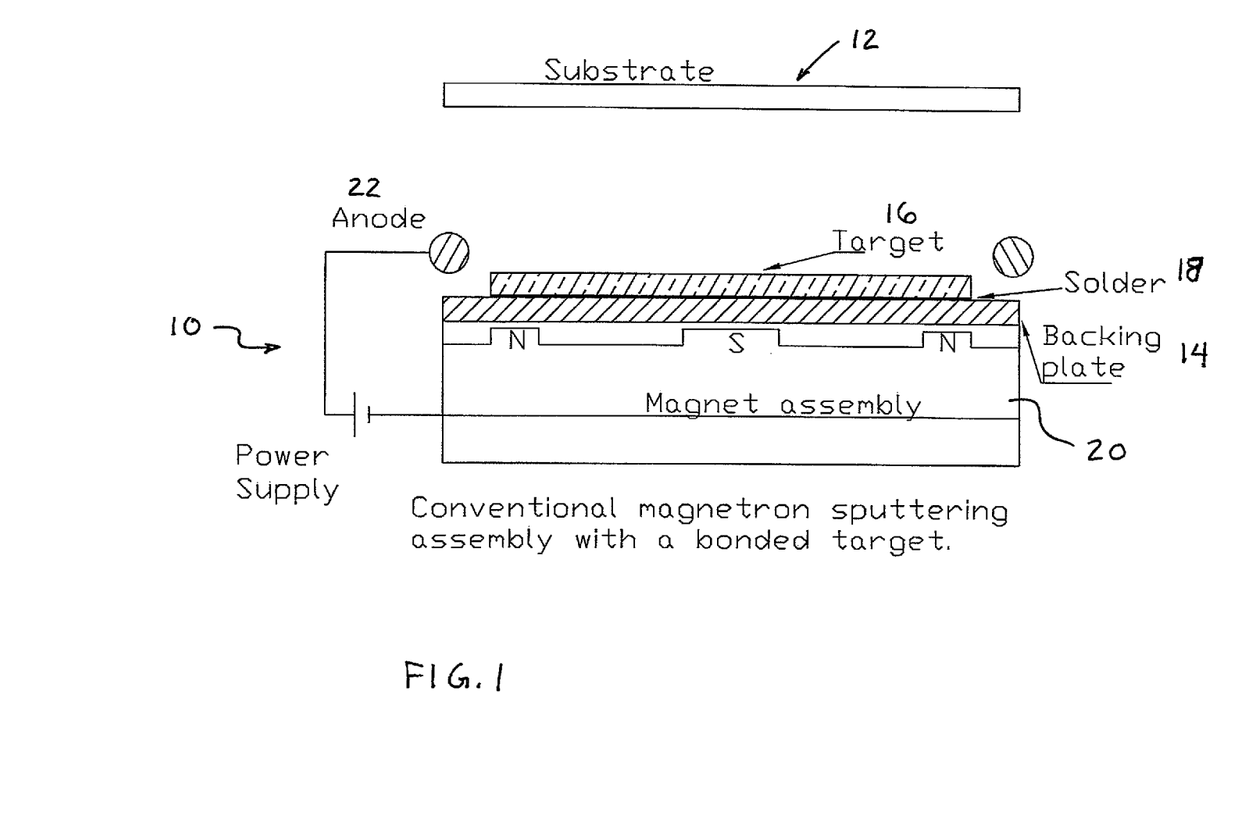
FIG. 1 is a side elevation and partial sectional view of a conventional magnetron sputtering assembly, with a target soldered to a backing plate.

For example, and with reference to FIG. 1, a conventional magnetron sputtering assembly 10 for sputter coating a substrate 12 (such as a glass substrate of a mirror reflective element) with a coating includes a backing plate 14 with a target 16 soldered to the backing plate 14 via a layer of solder 18. The backing plate 14 is on a magnet assembly 20, and an anode 22 is provided at the target. The magnet assembly 20 is provided at the backing plate and at an opposite side of the target from the substrate 12 to generate a magnetic field for focusing or containing the sputtering at the target. The conductive anode 22 is disposed between the substrate and the target, and a sputtering current is applied to sputter the target in a known manner.

There are several disadvantages with such known approaches. For example, during the sputtering process, the tiles may tend to heat up. There can be a steep thermal gradient from the top of the tile to the area where the tile is bonded to the backing plate, and such a gradient in conjunction with the differences in the coefficients of thermal expansion of the different materials can cause the tiles to crack or delaminate from the backing plate. Cracking can exacerbate the tendency of the target to arc, which typically results in process instability and particulate ejection from the target surface causing damage in the deposited film. Large cracks in the tiles can cause the bonding material and backing plate material to sputter and contaminate the depositing film.

Another disadvantage of such known approaches is the cost associated with such approaches, since the bonding process can be expensive and it typically involves many steps. Tiles are typically sputter coated with various layers to prevent diffusion of the indium solder through the tile and adhesion layers to promote adhesion to the backing plate. Flux is applied so that the molten indium wets the bonding surfaces. Small gaps (such as about 0.015 inches) need to be set between the tiles during the bonding process to allow for expansion. In order to prevent molten solder from filling the gap by capillary action, Kapton tape is typically applied to the backing plate in the area of the bond gap. To ensure a uniform solder thickness, thin metallic wires or spacers (such as about 0.3 mm thick) are typically used to set the tile distance from the backing plate.

Although the bonding process is typically expensive, it may be carried out successfully on a commercial basis. However, there is another disadvantage with the conventional processes that is not well understood. The ceramic materials tend to form nodules (such as described in M. Schlott et al., P-31: Nodule Formation on Indium-Oxide Tin-Oxide Sputtering Targets, SID Digest, 1997, which is hereby incorporated herein by reference in its entirety) on the surface of the target during sputtering. The surface density of nodules increases with time and is a source of target arcing, particulate formation, film contamination, sputtering rate decrease and overall process instability.

SUMMARY OF THE INVENTION

The present invention provides a sputtering assembly for sputtering a coating (such as an indium tin oxide (ITO) coating or other transparent conductive coating or metallic conductive coating or other coating or the like) onto a surface of a glass substrate, such as for a reflective element of a vehicular mirror assembly and such as in a vacuum deposition chamber. The sputtering assembly has one or more target tiles disposed on a separating and/or insulating sheet or layer or element, such as an electrically and thermally conductive sheet or layer or element with a low-coefficient of friction surface, such as a graphite sheet or the like, where the target tiles are not bonded or soldered to the low-friction sheet and thus are movable and can be heated during the sputtering process.

According to an aspect of the present invention, a sputtering assembly for sputtering a coating onto a glass substrate in a vacuum deposition chamber (such as sputtering a transparent conductive coating or other coating onto a glass substrate of a mirror reflective element for a vehicular interior or exterior rearview mirror assembly) includes a backing plate, a separating layer or element (such as a conductive, low-coefficient of friction element or layer) disposed on a surface or side of the backing plate, and at least one target element or tile disposed on the low-coefficient of friction element.

The low-coefficient of friction element may comprise any suitable element or layer or sheet having a low-coefficient of friction surface on which the target tile is disposed, such that the target tile may be relatively free to move along the surface or element. The low-coefficient of friction element is preferably electrically conductive and may be thermally conductive. Optionally, for example, the low-coefficient of friction surface may comprise a graphite sheet or layer.

Optionally, the sputtering assembly may include a plurality of target elements or tiles disposed or arranged on the low-coefficient of friction element or layer, with an expansion gap established between adjacent target tiles to allow for movement of and expansion of the target tiles during the sputtering process.

According to another aspect of the present invention, a method of sputter coating a glass substrate, such as sputter coating a metallic material onto a substrate in a vacuum deposition chamber, and such as sputter coating a glass substrate of a reflective element of a mirror assembly for a vehicle, comprises providing a glass substrate for a mirror assembly and providing a sputtering assembly for sputtering a coating onto the glass substrate (such as a transparent conductive coating onto a glass substrate of a mirror reflective element for a vehicular interior or exterior rearview mirror assembly). The sputtering assembly includes a backing plate, a low-coefficient of friction element or layer disposed on a surface or side of the backing plate, and at least one target element or tile disposed on the low-coefficient of friction element. An expansion gap is provided to allow for expansion of the target tile during the sputtering process. The tile or tiles may be allowed to heat to an elevated temperature during the sputtering process.

Optionally, the target tiles of the sputtering assembly may be substantially heated during the sputtering process to reduce imperfections that may occur in the sputter coating on the substrate. Optionally, the heating and cooling of the target tiles may be selectively controlled by varying the thickness of the low-coefficient of friction layer and/or by cooling the backing plate.

These and other objects, advantages, purposes and features of the present invention will become apparent upon review of the following specification in conjunction with the drawings.

DESCRIPTION OF THE PREFERRED EMBODIMENTS

Sputter coated substrates, such as sputter coated glass substrates, such as for use in electro-optic devices, such as electrochromic mirror reflective elements or cells for interior or exterior rearview mirror assemblies of vehicles, can develop cosmetic defects as a result of micron sized particulates that get embedded in the ITO (or other sputter coated material) film that is deposited onto the glass substrate of the reflective elements or cells. The present invention provides a solution to the problem of nodule formation by allowing the ceramic target to get substantially hot (such as to allow the target to reach a temperature of about 400-600 degrees C.). This may be accomplished by reducing the heat flow from the target to the backing plate (typically, a backing plate may be water-cooled and may function to cool the target during the sputtering process).

The present invention provides a sputter coating system where the target is allowed to heat up to an elevated temperature, and where there is no bonding material between the target and the backing plate, so that the tile may move and/or expand during the sputter coating and heating process without cracking of the tile. Thus, it is desirable to have an interspacing between the tiles to allow for lateral movement and expansion of the tiles during the sputtering process. The simplest form of the tile and separating sheet and backing plate arrangement is where the target tile rests, under the force of gravity, against the backing plate, and is a very useful technique in sputter up systems (where the substrate that is to be sputter coated is above the target and backing plate so that the target rests on the backing plate). Optionally, such as for side sputtering or sputter down systems, clamping components may be used to hold the target tile or tiles in place on the backing plate. In all cases, the tiles should not be held too tightly against the backing plate, and the assembly or system should provide sufficient room or gaps or spaces between the target tiles to allow for expansion of the target tiles as the target material gets hot. The CTE for ITO is ~$8 \times 10^{-6}$/C, so it is desirable that generous clearances be allowed in the design of a target assembly using such a material. Other clearances or gaps may be established between target tiles that may be more or less than this depending on the target material selected for sputter coating onto the glass substrate.

During the course of experimentation, it has been found that the likes of a copper backing plate of a sputtering assembly may be sputtered in regions where there is a gap between the target tiles arranged on the backing plate. This secondary sputtering of the copper material is undesirable because the sputtered copper can contaminate the growing films of indium tin oxide (ITO) or other selected or suitable material being deposited from the sputtering target and assembly onto a substrate positioned a distance therefrom in the vacuum deposition chamber, and may cause damage to the backing plate. The present invention provides a solution to this problem by providing a thin separating and/or insulating sheet or foil or layer or material, such as a thin graphite sheet (or other suitable material, such as a conductive material and/or a material that has a low-coefficient of friction surface) between the target tile or tiles and the backing plate (with the separating sheet being disposed over substantially the entire surface of the backing plate at which the tiles are disposed including the surface areas of the backing plate at gaps that may be provided between adjacent individual tiles disposed at the separating sheet and backing plate). A suitable graphite sheet is commonly known as GRAFOIL® flexible graphite, such as is commercially available from American Seal & Packing. However, other types of graphite sheets or thin or flexible graphite materials or other types of electrically conductive materials or other types of low-coefficient materials or sheets or elements or other types of materials that may be thermally conductive (and also thermally stable so as to withstand the potentially high temperatures encountered during the sputtering process) may be implemented while remaining within the spirit and scope of the present invention.

Because of the inherent low-coefficient of friction property of the preferred material selected for the separating sheet, lateral movement or slippage of the tiles relative to the separating sheet and backing plate is accommodated and allowed. In stark contrast, were a non-low-coefficient of friction material to be used in a similar construction at the backing plate, the unforgiving and non-accommodating, high friction, rigid bonding to the backing plate would not allow for such movement and expansion of the tiles relative to the separating sheet and backing plate. Also, it is desirable that the separating sheet of the system and method of the present invention have a high thermal stability and high thermal conductivity and preferably comprises a non-metallic material. Thus, the separating sheet provides an electrically conductive sheet and thermally conductive sheet with preferably a low-coefficient of friction contact surface on which the tiles may rest and/or contact.

Figure 2:
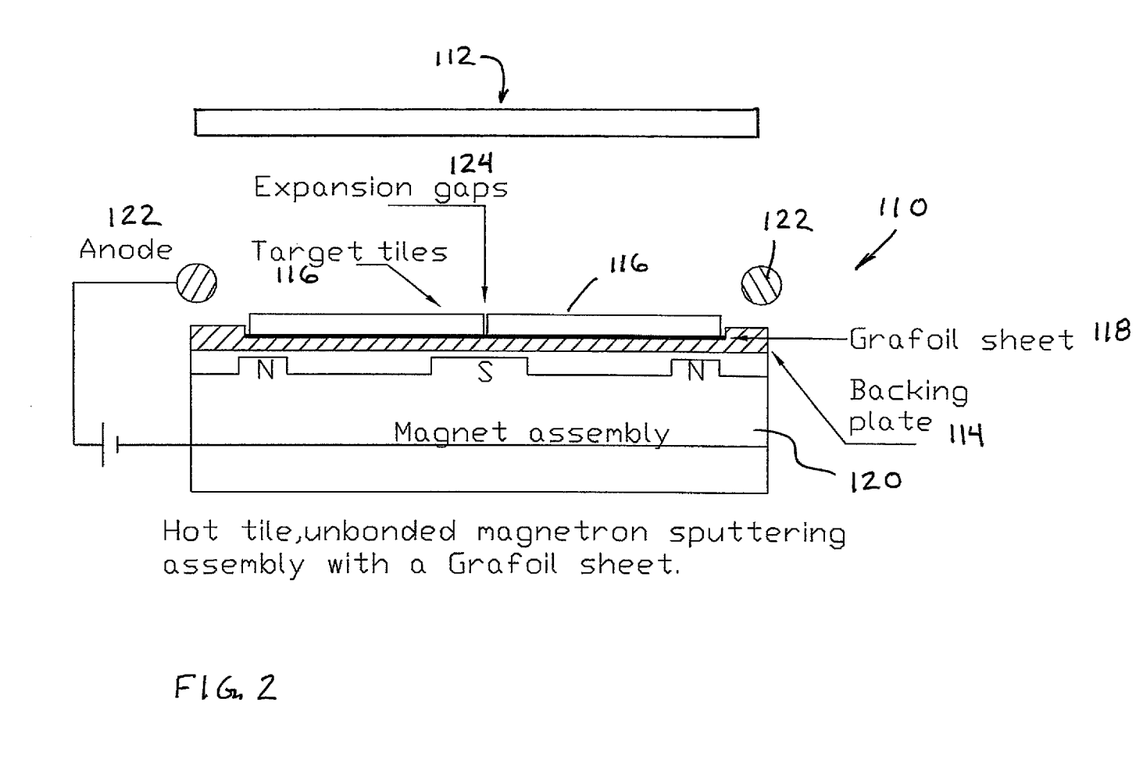
FIG. 2 is a side elevation and partial sectional view of a sputtering assembly in accordance with the present invention.

For example, and with reference to FIG. 2, a sputtering assembly 110 for sputter coating a substrate 112 (such as a glass substrate of a mirror reflective element) with a coating includes a backing plate 114 with one or more target elements or tiles 116 disposed thereon and with a separating and/or insulating sheet or element or layer 118 (such as a conductive, low-coefficient of friction sheet or element, such as a graphite sheet or the like) disposed between the target tiles 116 and the backing plate 114. The backing plate 114 (such as a copper backing plate that has a thickness in a range of between about ⅓ inch and ½ inch or thereabouts and that is sized to support the separating sheet and tiles thereon) is disposed at a magnet assembly 120, and an anode 122 is provided at the target tiles.

The magnet assembly 120 is provided at the backing plate and at an opposite side of the target tiles 116 from the substrate 112 to generate a magnetic field for focusing or containing the sputtering at the target, such as in a known manner.

For example, the sputtering assembly and substrate may be disposed within a sputtering chamber or vacuum deposition chamber and the chamber may be brought to a reduced pressure or partial vacuum and back-filled to a desired pressure with Argon gas (and Oxygen may optionally be added depending on the particular application and/or process). The sputtering assembly is connected to a negative electrode of a power supply and a discharge is struck. The Argon atoms are then ionized and, because the target tiles (such as ITO tiles) are at a negative potential, the positively charged Argon ions are accelerated and strike the target tiles and cause the target tile material to sputter away, whereby the sputtered material is deposited on the glass substrate.

Optionally, a plurality of target tiles 116 may be disposed on the separating sheet 118, with an expansion gap 124 established between adjacent tiles 116 to allow for expansion of the tiles during the heating and sputtering process. For example, an array or grid of small target tiles (such as a plurality of one inch square tiles or the like) may be arranged on the separating sheet and backing plate. If there were no separating sheet between the tiles and backing plate, the Argon ions may strike the copper backing plate through the gaps between the tiles and sputter the copper material, which would result in copper being sputtered onto the substrate with the ITO (or other material). Thus, the separating sheet (such as a graphite sheet or other suitable sheet material) not only provides a conductive sheet and optionally, and desirably, a low-coefficient of friction surface on which the tiles may rest and/or contact and/or be supported, but also limits or substantially precludes sputtering of the metal material, such as copper material or the like, of the backing plate during the sputtering process.

Another advantage of the separating sheet or gasket (such as a GRAFOIL® gasket or the like) that is placed between the cooling plate or backing plate and target tiles is that the thermal transfer between the cooling plate and target tiles is more uniform and this helps to prevent "hot spots" in the tiles during sputtering. Such hot spots can cause the sputtering rate to vary and thermal gradients can cause tiles to crack and break. Typically, the surfaces of the tiles and cooling plates are not flat on a microscopic level and thus may contact each other in random locations. The thermal conductivity across these gaps, especially under vacuum, may be very poor. The separating sheet increases the effective surface area contact. During the sputtering process, the separating sheet may at least partially thermally insulate or isolate the target tiles from the backing plate, and allows the target tiles to heat to a substantially elevated temperature, such as, for example, up to about 400-600 degrees C. or thereabouts. Such heating of the target tiles functions to substantially reduce the formation of nodules or imperfections on the target tiles and thus limits or substantially reduces imperfections in the sputter coating on the glass substrate. The improved uniformity in thermal transfer across and through the separating sheet helps to prevent cracking of the tiles.

The elevated temperature to which the target tiles are heated may be selectively controlled or regulated by the selection of the separation sheet or element (such as the material and/or thickness of the sheet or element) disposed between the target tiles and the backing plate, which may be a water-cooled backing plate. For example, a separating sheet having an increased thickness dimension may allow the target tiles to heat to a higher temperature (due to the increase in thermal insulation provided by the sheet between the target tiles and the backing plate) as compared to a separating sheet having a reduced or less thickness dimension (which allows more heat to conduct from the heated target tiles to the cooled backing plate). The thickness of the separating sheet thus may be selected depending on the desired or appropriate heating temperature of the target tiles and/or the selected material of the separating sheet (and depending on the thermal conductivity characteristics of the sheet material). For example, a graphite sheet (or other suitable separating sheet) may have a thickness of about 0.01 inches to about 0.1 inches, and more preferably a thickness of about 0.01 inches to about 0.06 inches or thereabouts. However other thicknesses (such as less than 0.01 inches or greater than 0.06 inches) may be selected depending on the particular application and process. Preferably, the separating sheet or element is sufficiently thin so as to not act as a thermal barrier between the tile and the backing plate. The temperature of the tiles thus may be controlled or regulated by the selection of the separating sheet material and thickness of the separating sheet (for example, a thicker separating sheet may result in a slower heat loss at the tiles and thus may result in the tiles heating to a higher temperature during the sputter process). Optionally, the temperature to which the target tiles are heated may also or otherwise be controlled or regulated by the temperature and flow rate of the water (or other cooling medium) that may be introduced at or in the backing plate to cool the backing plate and thus to at least partially cool the target tiles.

In the illustrated sputter up application of FIG. 2, the target tiles 116 may rest on the separating sheet 118 under the forces of gravity, with no additional clamping of the tiles to the backing plate. Thus, as the target tiles are reduced during the sputtering process (as the material of the tiles is sputtered away during the sputter coating process), the tiles may be readily moved or rearranged to provide enhanced and extended performance of the target. For example, if the tiles at or near a center region of the sputtering assembly wear faster than the outer tiles, the tiles may be readily redistributed or rearranged on the separating sheet so that the less worn outer tiles are moved to the center region and the more worn center tiles are moved to the outer regions, thereby increasing the life cycle of the sputtering assembly and wasting less target material or tiles. For example, the target tiles may be rearranged or redistributed at each quarter of the estimated life cycle of the target tiles, such as after about 100 KWh of use (typically, a target tile may last about 400 KWh of use).

In the illustrated embodiment of FIG. 2, the target tiles rest on the separating sheet 118 and are held in place by gravity. Such a configuration is suitable for a sputtering up process only. Optionally, the target tiles may be clamped or otherwise retained at the separating sheet so that the magnetron assembly may be used in a sideways or downward sputtering system. For example, and with reference to FIG. 3, a sputtering assembly 210 for sputter coating a substrate (such as a glass substrate of a mirror reflective element, not shown in FIG. 3) with a coating includes a backing plate 214 with one or more target tiles 216 disposed thereon and with a separating sheet or element 218 (such as a conductive, low-coefficient of friction sheet or element, such as a graphite sheet or the like) disposed between the target tiles 216 and the backing plate 214, such as in a similar manner as discussed above. The backing plate 214 is disposed at a magnet assembly 220, and an anode 222 is provided at the target tiles. The magnet assembly 220 is provided at the backing plate and at an opposite side of the target tiles 216 from the substrate to generate a magnetic field for focusing or containing the sputtering at the target, such as in a known manner and such as discussed above.

Figure 3:
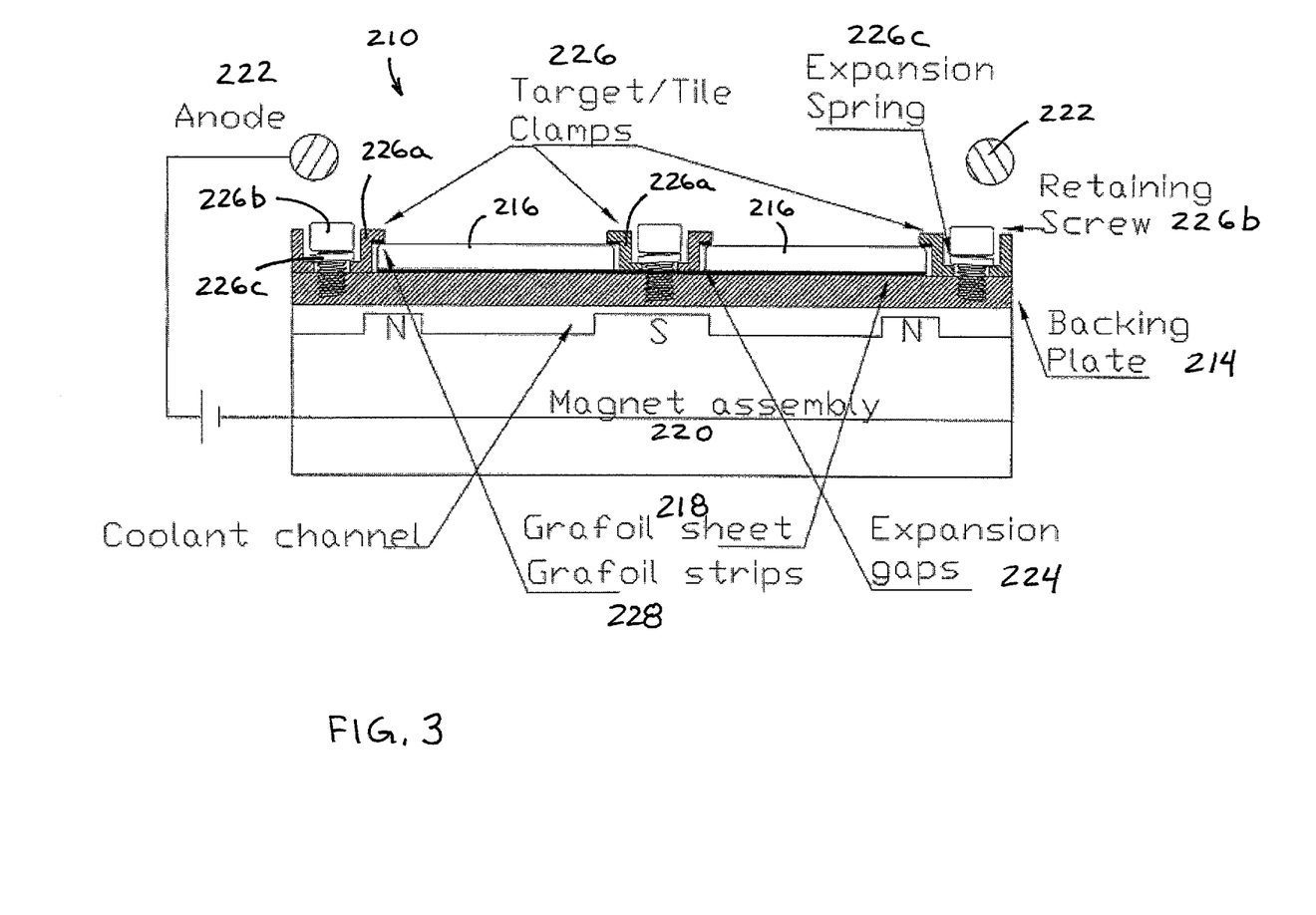
FIG. 3 is a side elevation and partial sectional view of another sputtering assembly of the present invention.

As shown in FIG. 3, the tiles 216 are retained at the backing plate 214 and separating sheet 218 via a plurality of clamps 226 disposed at some of the perimeter edges of the target tiles 216. In the illustrated embodiment, the clamps 226 comprise metallic clamping elements 226a that are generally S-shaped, so that an outer lip of the clamping elements 226a overlaps a portion of the perimeter edge of a target tile 216, while an inner or lower lip of the clamping elements 226a is retained at the backing plate 214 and separating sheet 218, such as via a respective fastener or retaining screw 226b (such as a threaded fastener or screw or bolt that is threadedly received in a respective threaded bore in or at the backing plate 214) or the like. The clamps 226 may also include a compression/expansion spring 226c or other expandable element between the fastener 226b and the inner lip of the clamping elements 226a. The expansion springs or elements allow the clamping elements to move in a generally perpendicular direction (relative to the backing plate 214) to accommodate for the expansion of the tiles as they heat up and expand during the sputtering process. As can be seen in FIG. 3, the tiles may be sized so that there are lateral expansion gaps 224 between the perimeter edges of the tiles and the clamping elements 226a, in order to allow for lateral expansion of the tiles during the sputtering process.

Optionally, in order to avoid direct contact between the outer clamping lip of the clamping elements 226, the lower surface of the outer clamping lip may have a separating strip or sheet 228 (such as a graphite strip or the like) disposed thereat, so that the separating strips 228 are disposed between the target tiles 216 and the clamping elements 226. Optionally, and desirably, the perimeter edges of the target tiles may be rounded or otherwise may have any sharp corners removed at least at the locations where the tiles are clamped by the clamps, in order to reduce or limit or substantially preclude cracking of the tiles at their edges.

Optionally, the target tile clamps may be fabricated from magnetic materials. In processes where a low discharge or target voltage is required, the target clamps may be used to focus the magnetic field over the target surface in such a way that the discharge voltage is reduced for a given power input.

Figure 4:
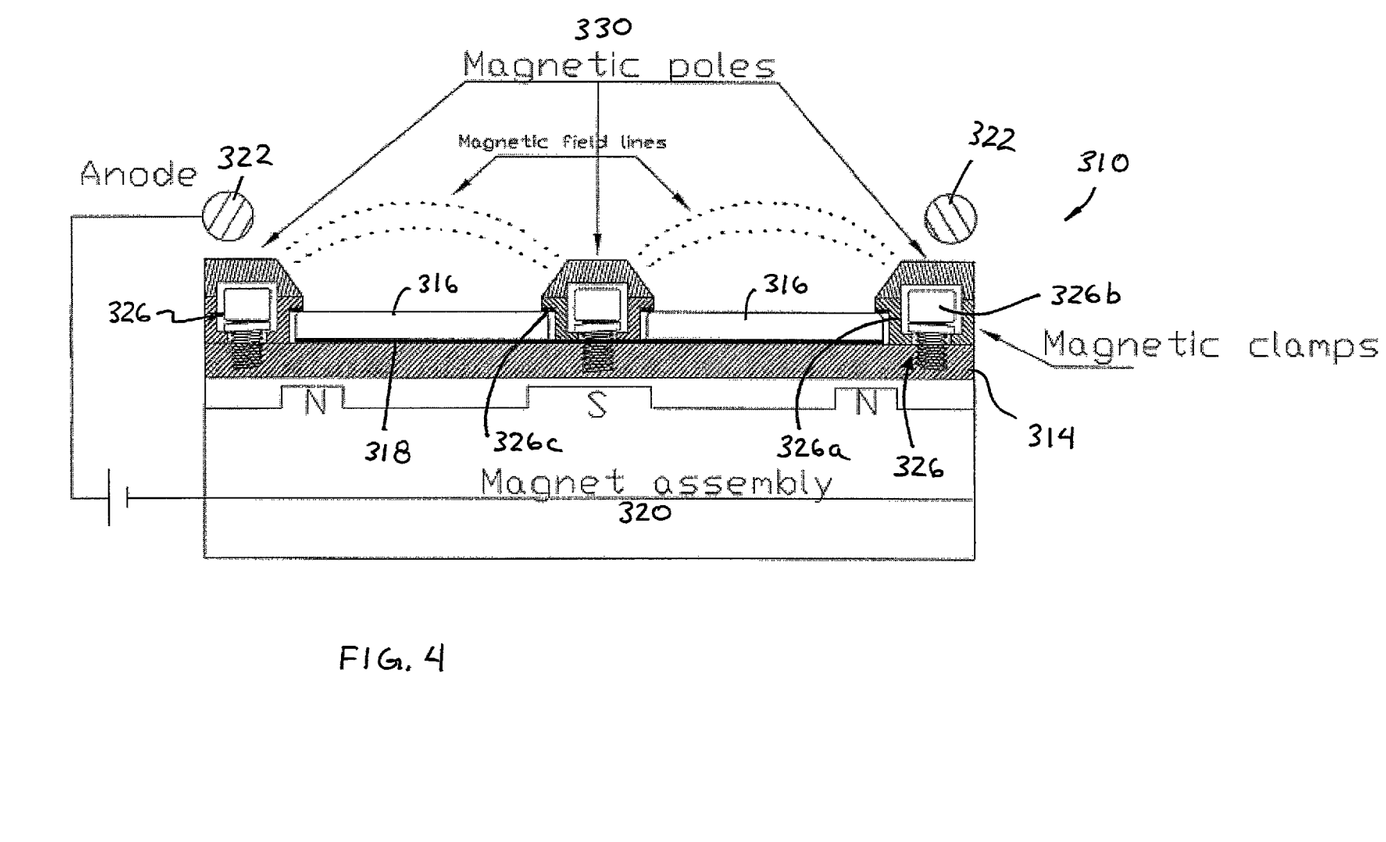
FIG. 4 is a side elevation and partial sectional view of another sputtering assembly of the present invention.

For example, and with reference to FIG. 4, a sputtering assembly 310 for sputter coating a substrate (such as a glass substrate of a mirror reflective element, not shown in FIG. 4) with a coating includes a backing plate 314 with one or more target tiles 316 disposed thereon and with a separating sheet or element 318 (such as a conductive, low-coefficient of friction sheet or element, such as a graphite sheet or the like) disposed between the target tiles 316 and the backing plate 314, and with a plurality of clamps 326 clamping the tiles 316 at the backing plate 314, such as in a similar manner as discussed above. The backing plate 314 is disposed at a magnet assembly 320, and an anode 322 is provided at the target tiles, and the magnet assembly 320 is provided at the backing plate and at an opposite side of the target tiles 316 from the substrate to generate a magnetic field for focusing or containing the sputtering at the target, such as in a known manner and such as discussed above. In the illustrated embodiment, the clamps 326 comprise clamping elements 326a, which are retained at the backing plate 314 via fasteners 326b and expansion springs 326c, such as in a similar manner as described above.

As shown in FIG. 3, the clamps may comprise magnetic clamps and magnetic poles 330 that have contoured pole faces so that the magnetic field may be focused in order to minimize or reduce the discharge voltage while remaining at or near the desired sputtering rate. The magnetic clamps and pole pieces may comprise any suitable magnetic material, such as, for example, iron, nickel, magnetic alloys or the like. Optionally, and with an appropriate arrangement of the clamps, a magnetic field strength of several thousand Gauss may be obtained over the target surface for low voltage sputtering processes. Other contours or configurations may be used to improve or enhance the utilization of the target material by creating a more uniform discharge over a larger area of the target.

With bonded ceramic targets (such as ITO targets and/or the like), power densities of up to about 60 W/in$^2$ may be used. The hot tile assemblies of the present invention may operate well at up to about 26 W/in$^2$. However, the sputtering rate may be reduced by only about 25 percent even though the power density is reduced by a factor of about 2.3. The sputtering rate per unit power density may be higher for the hot tile assemblies of the present invention as compared to conventional bonded targets because of the elevated temperature of the target tiles during the sputtering process. A high quality ITO thin film with high transmission (such as at least about 75 percent photopic transmission and more preferably at least about 85 percent photopic transmission), good adhesion and good abrasion resistance and specific resistivity of less than about $1.5 \times 10^{-4}$ Ohm-cm may be produced using the hot tile magnetron assemblies of the present invention. Also, the hot tile magnetron assemblies limit or reduce or substantially preclude or eliminate nodule formation on the target surface, such that there are reduced or minimal or no embedded particulates in the sputtered film on the glass substrate.

Typically, the target area or size for sputtering a film on a glass substrate may be about 6 inches by about 25 inches or about 150 mm by about 750 mm or thereabouts. Typically, the target tiles that make up the target and that are disposed at the backing plate are sized in a range of about 0.75 square inches to about 2 square inches, and optionally or preferably in a range of about 1 square inch to about 1.5 square inches. Such tiles may have a thickness in a range of about 3 to 15 mm, and preferably have a thickness in a range of about 5 to 10 mm, and optionally or preferably in a range of about 6 to 8 mm or thereabouts. The gap established between the individual tiles may be within a range of about 0.005 inches to about 0.035 inches or thereabouts, and preferably within the range of about 0.010 inches to about 0.030 inches, and optionally or preferably within the range of about 0.015 inches to about 0.025 inches, such as about 0.020 inches or 20 mils or thereabouts. However, other sizes and thicknesses of the tiles and other sized interspacings between the adjacent individual tiles may be implemented while remaining within the spirit and scope of the present invention.

The tiles may comprise any suitable material. It has been found that the method and system of the present invention is particularly useful for pressed oxide material tiles, such as a pressed metal oxide, such as a pressed ITO tile or material. Optionally, and desirably, a hot isostatic pressing/pressed target tile or HIP ITO target tile may be used in a sputtering system or method in accordance with the present invention.

During the sputtering process, the tiles may experience temperatures in excess of 500 degrees C. and may be seen to glow red hot. Thus, the separating sheet (such as a graphite sheet or GRAFOIL® sheet or the like) preferably has a temperature stability of at least about 750 degrees C., and more preferably has a temperature stability of greater than about 1000 degrees C., and more preferably has a temperature stability of greater than about 1500 degrees C. or thereabouts.

It has been found that good results can be achieved using the sputter-up configuration such as shown in FIG. 2. Surprisingly, it has been found that gravity sustains the placement of the tiles and the expansion gaps during the sputter deposition process. However, for other configurations, such as sputter down or sideways sputtering configurations or applications (such as discussed above with reference to FIGS. 3 and 4), clamping can be used or other affixing means can be used to retain the tiles at the separating sheet and backing plate when the backing plate may be tilted or oriented to a non-horizontal orientation, provided such clamping or affixing tolerates and allows lateral slippage or movement of the tiles on the separating sheet and backing plate (such as, for example, via expansion gaps between adjacent individual tiles and/or expansion gaps or expansion capabilities at the clamping means itself).

Although described as having ITO target tiles, clearly, the sputtering assembly of the present invention may be suitable for use with other target tiles and target materials. For example, target tiles comprising other transparent conductive materials may be utilized or target tiles of other metallic materials may be utilized in the sputtering assembly of the present invention. Also, although described as comprising a graphite sheet or layer or element, the separating sheet of the sputtering assembly of the present invention may comprise other suitable materials, such as other materials that are electrically conductive and/or that may provide a low coefficient of friction surface on which the target tiles may be disposed, while remaining within the spirit and scope of the present invention.

Therefore, the present invention provides a sputtering assembly that has target tiles non-bonded and movably disposed on a backing plate with a low-coefficient of friction element (such as a graphite sheet) disposed between the tiles and the backing plate. The sputtering assembly of the present invention thus allows for heating and expansion of the target tiles during the sputtering process, with the movement of the tiles relative to the sheet and backing plate limiting or reducing cracking of the tiles or backing plate during the sputtering process. The sputtering assembly thus allows for heating of the target tiles during the sputtering process and thus may reduce imperfections and defects that may occur in the sputtered coating on the glass substrate. Also, the present invention avoids or reduces or eliminates some of the additional steps and costs associated with manufacturing a sputtering assembly, and thus provides a lower cost sputtering assembly that provides enhanced sputter coating of a glass substrate.

There are also some additional benefits to use of a graphite sheet or other suitable separating sheet or element. For example, a graphite sheet (such as, for example, a GRAFOIL® flexible graphite sheet) typically has a low coefficient of friction and thus may feel very smooth and slippery to the touch. The target tiles thus can move more smoothly on and over the graphite sheet as compared to on a copper backing plate. One can also control the cooling rate of the target by using such graphite (or other suitable material) sheets or foils of different thicknesses (such as in a range of about 0.01 mm to about 0.5 or to about 1.5 mm or thereabouts), and thus can adjust or adapt the target depending on the particular application.

Another advantage of this approach is that the target tiles may be rearranged to provide improved target utilization. Typically, with a bonded tile assembly, the planar magnetron can yield about 40-50 percent target utilization (due to the greater wear or reduction of the tile material at a center region as compared to the outer regions of the tile, whereby the tile may be scrapped before the outer regions have worn or have been used). With the unbonded assembly of the present invention, the target tiles can be rearranged on the graphite sheet to provide enhanced and extended performance of the sputter target, whereby the magnetron or target can yield about 70 percent or more (and such as about 80 percent of the tile material) if the tiles are rearranged periodically, such as at about every 100 KWh of target life or thereabouts. The flexible graphite sheet is also useful for unbonded metallic targets and can improve the thermal contact between the target material and cooling plate.

Optionally, the sputter coated substrate or substrates may be used in a mirror assembly of a vehicle, such as an electro-optic or electrochromic rearview mirror assembly, which may include an electro-optic or electrochromic reflective element, and may utilize the materials and/or principles disclosed in commonly assigned U.S. Pat. Nos. 7,255,451; 7,274,501; 7,195,381; 7,184,190; 6,690,268; 5,140,455; 5,151,816; 6,178,034; 6,154,306; 6,002,544; 5,567,360; 5,525,264; 5,610,756; 5,406,414; 5,253,109; 5,076,673; 5,073,012; 5,117,346; 5,724,187; 5,668,663; 5,910,854; 5,142,407 and/or 4,712,879, and/or U.S. patent application Ser. No. 11/912,576, filed Oct. 25, 2007, now U.S. Pat. No. 7,626,749, which are all hereby incorporated herein by reference in their entireties, and/or as disclosed in the following publications: N. R. Lynam, "Electrochromic Automotive Day/Night Mirrors", SAE Technical Paper Series 870636 (1987); N. R. Lynam, "Smart Windows for Automobiles", SAE Technical Paper Series 900419 (1990); N. R. Lynam and A. Agrawal, "Automotive Applications of Chromogenic Materials", Large Area Chromogenics: Materials and Devices for Transmittance Control, C. M. Lampert and C. G. Granquist, EDS., Optical Engineering Press, Wash. (1990), which are hereby incorporated by reference herein in their entireties. The thicknesses and materials of the coatings on the substrates, such as on the third surface of the reflective element assembly, may be selected to provide a desired color or tint to the mirror reflective element, such as a blue colored reflector, such as is known in the art and such as described in U.S. Pat. Nos. 5,910,854; 6,420,036; and/or 7,274,501, which are hereby incorporated herein by reference in their entireties.

Optionally, the sputter coated substrate or substrates may be used in a mirror assembly that may comprise a prismatic mirror assembly or a non-electro-optic mirror assembly, and that may utilize aspects of the mirror assemblies described in U.S. Pat. Nos. 7,338,177; 7,289,037; 7,249,860; 6,318,870; 6,598,980; 5,327,288; 4,948,242; 4,826,289; 4,436,371; and 4,435,042, which are hereby incorporated herein by reference in their entireties. Optionally, a prismatic reflective element may comprise a conventional prismatic reflective element or prism or may comprise a prismatic reflective element of the types described in U.S. Pat. Nos. 7,420,756; 7,289,037; 7,274,501; 7,249,860; 7,338,177; and/or 7,255,451, which are hereby incorporated herein by reference in their entireties, without affecting the scope of the present invention.

Changes and modifications in the specifically described embodiments may be carried out without departing from the principles of the present invention, which is intended to be limited only by the scope of the appended claims as interpreted according to the principles of patent law.

The invention claimed is:

1. A sputtering assembly for sputtering a coating onto a glass substrate in a vacuum deposition chamber, said sputtering assembly comprising:
a backing plate;
a separating element disposed at said backing plate;
at least one target element disposed at a surface of said separating element, wherein said at least one target element contacts said separating element and wherein said at least one target element is not bonded to said separating element;

wherein, during a sputtering process that sputters a coating onto a glass substrate, said at least one target element is disposed at an upper surface of said separating element and is vertically held in place by gravity;

wherein at least one expansion gap is provided at or adjacent to said at least one target element to allow for thermal expansion of said at least one target element relative to said separating element during the sputtering process; and wherein said at least one target element is capable of movement relative to said separating element and along said upper surface of said separating element during the sputtering process.

2. The sputtering assembly of claim 1, wherein said separating element comprises an electrically conductive material.

3. The sputtering assembly of claim 1, wherein said separating element comprises a sheet having a low-coefficient of friction surface, and wherein said at least one target element is disposed on said low-coefficient of friction surface of said separating element.

4. The sputtering assembly of claim 1, wherein said separating element comprises a graphite sheet.

5. The sputtering assembly of claim 1, wherein said separating element thermally insulates said at least one target element from said backing plate, and allows said at least one target element to achieve a substantially elevated temperature during the sputtering process.

6. The sputtering assembly of claim 5, wherein said at least one target element, at least in part due to the sputtering process, achieves a substantially elevated temperature in the range of about 400 to 600 degrees C. during the sputtering process.

7. The sputtering assembly of claim 1, wherein said at least one target element comprises a plurality of target elements arranged on said separating sheet with expansion gaps established between adjacent target elements to allow for expansion of said target elements during the sputtering process.

8. The sputtering assembly of claim 1, wherein said at least one target element is retained at said backing plate via at least one clamping element.

9. The sputtering assembly of claim 8, wherein said clamping element comprises an expansion element so as to substantially retain said target element at said backing plate while allowing for expansion of said target element during the sputtering process.

10. The sputtering assembly of claim 1, wherein said sputtering assembly is for sputtering a transparent conductive coating onto a glass substrate of a mirror reflective element for a vehicular interior or exterior rearview mirror assembly.

11. The sputtering assembly of claim 1, wherein said at least one target element is retained at said backing plate via at least one retaining element, and wherein said at least one retaining element is configured to allow for thermal expansion of the tiles in a direction generally orthogonal to said backing plate.

12. The sputtering assembly of claim 1, wherein said at least one target element is retained at said backing plate via at least one retaining element, and wherein said at least one retaining element and said at least one expansion gap are configured to allow for thermal expansion of the tiles in a direction generally parallel to said backing plate.

* * * * *